(12) United States Patent
Huang et al.

(10) Patent No.: US 10,483,369 B2
(45) Date of Patent: Nov. 19, 2019

(54) METHODS OF FORMING REPLACEMENT GATE STRUCTURES ON TRANSISTOR DEVICES

(71) Applicant: GLOBALFOUNDRIES Inc., Grand Cayman (KY)

(72) Inventors: Haigou Huang, Rexford, NY (US); Xusheng Wu, Ballston Lake, NY (US); Jinsheng Gao, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/797,723

(22) Filed: Oct. 30, 2017

(65) Prior Publication Data

US 2019/0131428 A1 May 2, 2019

(51) Int. Cl.
*H01L 29/66* (2006.01)
*H01L 21/8234* (2006.01)
*H01L 27/088* (2006.01)
*H01L 21/8238* (2006.01)

(52) U.S. Cl.
CPC .. *H01L 29/66545* (2013.01); *H01L 21/82345* (2013.01); *H01L 21/823431* (2013.01); *H01L 21/823437* (2013.01); *H01L 21/823842* (2013.01); *H01L 27/0886* (2013.01)

(58) Field of Classification Search
CPC ......... H01L 27/0886; H01L 21/823437; H01L 21/823431; H01L 29/66545; H01L 21/823842; H01L 21/82345
See application file for complete search history.

(56) References Cited

U.S. PATENT DOCUMENTS

| 4,897,154 | A | 1/1990 | Chakravarti et al. |
| 8,647,972 | B1 * | 2/2014 | Ando ............... H01L 21/28088 |
| | | | 257/E21.294 |
| 9,048,262 | B2 * | 6/2015 | Adam ................ H01L 29/6681 |
| 9,064,890 | B1 * | 6/2015 | Xie ................ H01L 21/823431 |
| 9,070,635 | B2 | 6/2015 | Liao et al. |
| 9,147,748 | B1 | 9/2015 | Xie et al. |
| 9,236,480 | B2 * | 1/2016 | Xie ................... H01L 21/76224 |
| 9,318,574 | B2 * | 4/2016 | Cheng ............... H01L 29/66545 |
| 9,318,582 | B2 * | 4/2016 | Basker ................ H01L 29/785 |

(Continued)

FOREIGN PATENT DOCUMENTS

| TW | 201603270 A | 1/2016 |
| TW | 201621981 A | 6/2016 |

OTHER PUBLICATIONS

Office Action from related U.S. Appl. No. 15/797,837 dated Nov. 27, 2018.

(Continued)

*Primary Examiner* — Ismail A Muse
*Assistant Examiner* — Charles N Ausar-El
(74) *Attorney, Agent, or Firm* — Amerson Law Firm, PLLC

(57) ABSTRACT

One illustrative method disclosed herein includes, among other things, forming a sacrificial gate structure above a semiconductor substrate, the sacrificial gate structure comprising a sacrificial gate insulation layer and a multi-layer sacrificial gate electrode structure, removing the sacrificial gate structure to form a replacement gate cavity, and forming a replacement gate structure in the replacement gate cavity.

11 Claims, 13 Drawing Sheets

(56) References Cited

U.S. PATENT DOCUMENTS

| | | | |
|---|---|---|---|
| 9,450,072 B2* | 9/2016 | Chou | H01L 29/66545 |
| 9,472,407 B2* | 10/2016 | Jagannathan | H01L 29/78 |
| 9,508,642 B2* | 11/2016 | Bouche | H01L 23/528 |
| 9,515,070 B2* | 12/2016 | Horak | H01L 29/66545 |
| 9,536,040 B2 | 1/2017 | Zhang et al. | |
| 9,659,779 B2* | 5/2017 | Cheng | H01L 29/66545 |
| 9,704,993 B2 | 7/2017 | Basker et al. | |
| 9,812,552 B2 | 11/2017 | Jun et al. | |
| 9,842,739 B2* | 12/2017 | Cheng | H01L 29/66545 |
| 10,083,961 B2 | 9/2018 | Bergendahl et al. | |
| 10,134,604 B1* | 11/2018 | Huang | H01L 21/32053 |
| 2010/0019292 A1* | 1/2010 | Kim | C09K 13/02 |
| | | | 257/288 |
| 2011/0195575 A1 | 8/2011 | Wang | |
| 2011/0230052 A1 | 9/2011 | Tang et al. | |
| 2011/0298061 A1 | 12/2011 | Siddiqui et al. | |
| 2012/0164830 A1 | 6/2012 | Lee et al. | |
| 2012/0196447 A1 | 8/2012 | Yang et al. | |
| 2014/0367803 A1 | 12/2014 | Yu et al. | |
| 2015/0054078 A1 | 2/2015 | Xie et al. | |
| 2015/0129962 A1* | 5/2015 | Xie | H01L 27/1211 |
| | | | 257/347 |
| 2016/0071799 A1 | 3/2016 | Hsieh et al. | |
| 2016/0172467 A1* | 6/2016 | Jang | H01L 29/51 |
| | | | 438/283 |
| 2016/0181383 A1 | 6/2016 | Huang et al. | |
| 2016/0247888 A1* | 8/2016 | Kerber | H01L 29/66545 |
| 2016/0315080 A1* | 10/2016 | Song | H01L 21/823431 |
| 2016/0380082 A1 | 12/2016 | Yu et al. | |
| 2017/0154995 A1* | 6/2017 | Ontalus | H01L 29/7848 |
| 2017/0358684 A1 | 12/2017 | Chen et al. | |
| 2018/0047754 A1 | 2/2018 | Basker et al. | |
| 2018/0122643 A1* | 5/2018 | Cheng | H01L 29/66545 |
| 2018/0219080 A1 | 8/2018 | Clendenning et al. | |

OTHER PUBLICATIONS

Translation of Examination Report from Taiwan Patent Application No. 107117707 dated Apr. 3, 2019.

Notice of Allowance from related U.S. Appl. No. 15/797,837 dated Jul. 12, 2019.

* cited by examiner

Fig. 1    (Prior Art)

METHODS OF FORMING REPLACEMENT GATE STRUCTURES ON TRANSISTOR DEVICES

BACKGROUND OF THE INVENTION

1. Field of the Invention

The present disclosure generally relates to the fabrication of integrated circuits, and, more particularly, to various novel methods of forming replacement gate structures on transistor devices and the resulting novel device structures.

2. Description of the Related Art

In modern integrated circuits, such as microprocessors, storage devices and the like, a very large number of circuit elements, especially transistors, are provided on a restricted chip area. Field Effect Transistors ("FETs") come in a variety of shapes and forms, e.g., planar transistors, FinFET transistors, vertical transistors, nanowire devices, etc.

A conventional planar FET is a planar device wherein the entire channel region of the device is formed parallel and slightly below the planar upper surface of the semiconducting substrate. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12 wherein the fins 14 of the device 10 are made of the material of the substrate 12, e.g., silicon. The device 10 includes a plurality of fin-formation trenches 13, three illustrative fins 14, a gate structure 16, a sidewall spacer 18 and a gate cap layer 20. The spacer 18 is typically made of silicon nitride, but in some cases it may be made of a material having a lower dielectric constant (k) than that of silicon nitride. An insulating material 17, e.g., silicon dioxide, provides electrical isolation between the fins 14. The fins 14 have a three dimensional configuration: a height H, a width W and an axial length L. The axial length L corresponds to the gate length of the device, i.e., the direction of current travel in the device 10 when it is operational. The gate width of the device 10 is orthogonal to the gate length direction. The portions of the fins 14 covered by the gate structure 16 are the channel regions of the FinFET device 10. The portions of the fins 14 that are positioned outside of the spacers 18 will become part of the source/drain regions of the device 10.

For many FET devices, the gate structures are initially formed as continuous line-type structures that extend across the entire substrate, including across both active regions and isolation regions. In advanced integrated circuit (IC) products, the gate structures for the transistor devices are typically manufactured using the well-known replacement gate (or "gate-last") manufacturing technique. In general, the replacement gate manufacturing technique involves the formation of a sacrificial (or "dummy") gate structure comprised of a sacrificial gate insulation layer (e.g., silicon dioxide) and a layer of a sacrificial gate electrode material (e.g., polysilicon or amorphous silicon). Various process operations are performed with the sacrificial gate structure in position, e.g., source/drain implantation processes, the formation of epi semiconductor material in the source/drain regions of the transistor devices, etc. At some point in the manufacturing process, the sacrificial gate structure will be removed to define a replacement gate cavity. Thereafter, materials for the replacement gate structure will be formed in the replacement gate cavity and a final gate cap will be formed over the replacement gate structure. In advanced devices, such a replacement gate structure may comprise a high-k (k value of 10 or greater) gate insulation layer and one or more metal-containing layers of material that collectively function as the conductive gate electrode for the replacement gate structure.

For many FET devices, the initial sacrificial gate structures are initially formed as continuous line-type structures that extend across the entire substrate, including across both active regions and isolation regions. The long continuous line-type sacrificial gate structures are formed by depositing the materials for the sacrificial gate structures across the entire substrate, forming a patterned gate etch mask above the deposited sacrificial gate materials and performing one or more etching processes through the patterned gate etch mask to remove the exposed portions of the sacrificial gate materials. At that point, a spacer structure will be formed adjacent the long continuous line-type sacrificial gate structures. As noted above, at some point after other processing has occurred, e.g., after formation of epi material in the source/drain regions of the devices, portions of the long continuous line-type sacrificial gate structures will be removed or "cut" so as to define individual portions or segments of the original long continuous line-type sacrificial gate structures which will eventually be removed and replaced with final replacement gate structures. After the cutting process is completed, there is a "tip-to-tip" spacing between the individual sacrificial gate structures. The tip-to-tip spacing between the sacrificial gate structures is typically filled with an insulation material.

As device dimensions continue to decrease and as packing densities of transistor devices on a substrate continue to increase, various problems have arisen as it relates to manufacturing replacement gate structures on transistor devices. More specifically, as device scaling continues, the vertical height of the sacrificial gate structures has increased while the lateral width (i.e., gate length or critical dimension) of the sacrificial gate structures has decreased. As a result, the aspect ratio (height/lateral width) has increased, thereby making the cutting of the sacrificial gate structures into individual segments more problematic. For example, given the increased aspect ratio of the sacrificial gate structures on more advanced devices, the act of cutting the sacrificial gate structures may be incomplete in that undesirable residual amounts of the sacrificial gate material may remain in place after the cutting process is completed. The presence of such undesirable residual materials from the sacrificial gate structures may make the formation of quality replacement gate structures more difficult and such residual material may result in decreased device performance or complete device failure.

The present disclosure is directed to various novel methods of forming replacement gate structures on transistor devices and the resulting novel device structures that may eliminate or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming replacement gate structures on transistor devices and the resulting novel device structures. One illustrative method disclosed herein includes, among other things, forming a sacrificial gate structure above a semiconductor substrate, the sacrificial gate structure comprising a sacrificial gate insulation layer and a multi-layer sacrificial gate electrode structure, removing the sacrificial gate structure to form a replacement gate cavity, and forming a replacement gate structure in the replacement gate cavity.

Another illustrative method disclosed herein includes, among other things, forming a continuous line-type sacrificial gate structure above a semiconductor substrate by performing a method that includes forming a sacrificial gate insulation layer above the semiconductor substrate, forming a first sacrificial gate electrode material layer above the sacrificial gate insulation layer, and forming a second sacrificial gate electrode material layer above the first sacrificial gate electrode layer. In this example, the method also includes removing a portion of the second sacrificial gate electrode material layer and removing a portion of the first sacrificial gate electrode material layer so as to thereby form a first opening positioned above the sacrificial gate insulation layer and forming an insulating gate separation structure in the first opening. In this example, the method also includes removing materials of the sacrificial gate structure on opposite sides of the insulating gate separation structure to form first and second replacement gate cavities on opposite sides of the insulating gate separation structure and forming first and second replacement gate structures in the first and second replacement gate cavities, respectively.

One illustrative integrated circuit product disclosed herein includes a first final gate structure having a first end surface and a second final gate structure having a second end surface. In this embodiment, the integrated circuit product also includes an insulating gate separation structure positioned between the first and second final gate structures, wherein the first end surface contacts a first side surface of the insulating gate separation structure and the second end surface contacts a second side surface of the insulating gate separation structure. In this embodiment, the insulating gate separation structure has an inverted T-shaped cross-sectional configuration in at least one direction.

BRIEF DESCRIPTION OF THE DRAWINGS

The disclosure may be understood by reference to the following description taken in conjunction with the accompanying drawings, in which like reference numerals identify like elements, and in which.

Figure 1:
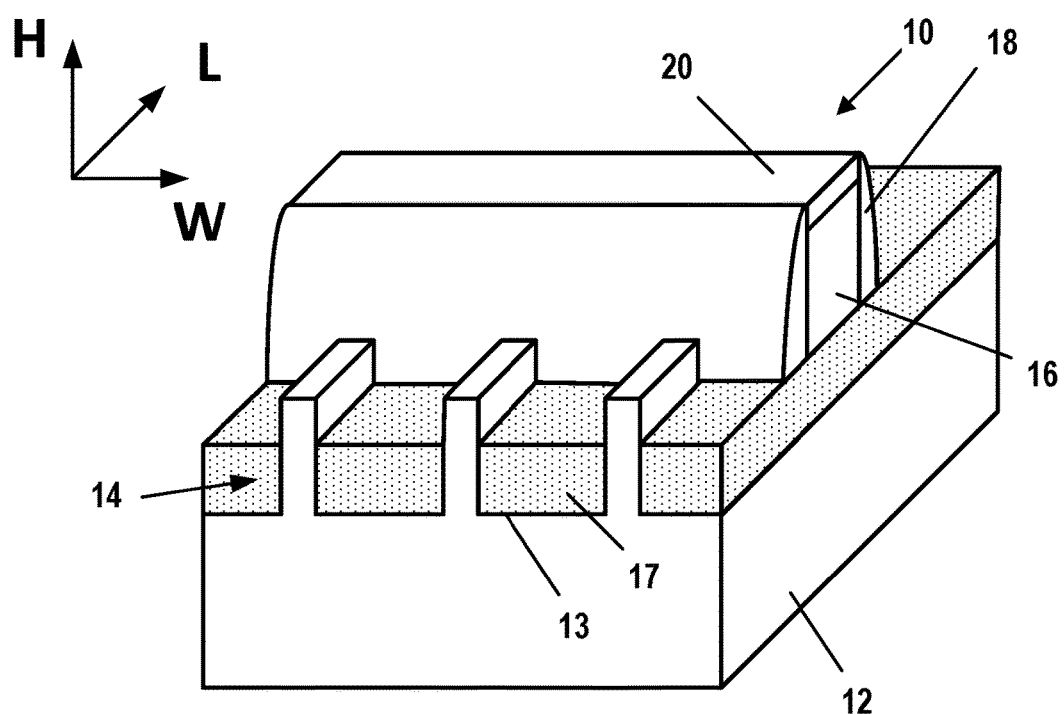
FIG. 1 is a simplistic depiction of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming gate structures on transistor devices and the resulting device structures. As will be readily apparent to those skilled in the art upon a complete reading of the present application, the presently disclosed methods may be employed when forming transistor devices having a variety of different configurations, e.g., planar transistor devices, vertical transistor devices, FinFET devices, etc. The illustrative examples described and depicted herein involve use of the methods disclosed herein to form an integrated circuit (IC) product 100 comprised of illustrative FinFET devices. However, the presently disclosed inventions should not be considered to be limited to any particular type or form of transistor device. Moreover, the methods and devices disclosed herein may be employed when forming a variety of products, including, but not limited to, logic products, memory products, etc. With reference to the attached figures, various illustrative embodiments of the methods and devices disclosed herein will now be described in more detail.

Figure 2:
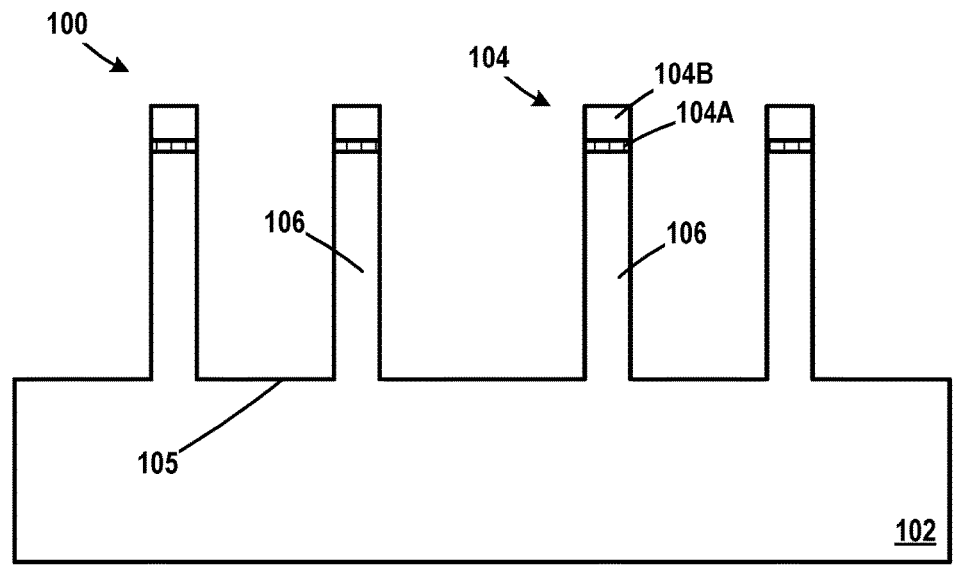
FIGS. 2-24 depict various novel methods disclosed herein related to the formation of replacement gate structures on transistor devices and the resulting device structures.

FIG. 2 depicts an IC product 100 that is formed in and above a semiconductor substrate 102. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices disclosed herein are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials. It should be noted that the final gate structure for the transistor devices disclosed herein may be formed by performing well-known replacement gate manufacturing techniques. Additionally, various doped regions, e.g., halo implant regions, doped source/drain regions, well regions and the like, are not depicted in the attached drawings. The transistor devices depicted herein may be either NMOS or PMOS transistors. The various components and structures of the transistor devices disclosed herein may be formed using a variety of different materials and by performing a variety of known techniques, e.g., a chemical vapor deposition (CVD) process, an atomic layer deposition (ALD) process, a thermal growth process, spin-coating techniques, epi growth processes, etc. The thicknesses of these various layers of material may also vary depending upon the particular application.

As shown in FIG. 2, a plurality of fins 106 has been formed in the substrate 102. FIG. 2 is a cross-sectional view of the product 100 that is taken through the fins 106 at a location where gate structures (not shown) will be formed for first and second FinFET devices. The cross-sectional view in FIG. 2 is taken in a direction that corresponds to the gate width direction of the transistor devices.

With continuing reference to FIG. 2, in the example depicted herein, each of the illustrative FinFET devices will be depicted as comprising two illustrative fins 106. Of course, the FinFET devices may be comprised of a single fin 106 or more than the two illustrative fins 106 depicted herein. In one illustrative example, the fins 106 were formed by performing one or more etching processes, e.g., anisotropic etching processes, through a patterned fin-formation etch mask 104 to form a plurality of fin-formation trenches 105 in the substrate 102 and thereby define the plurality of fins 106. The patterned fin-formation etch mask 104 is intended to be representative in nature as it may be comprised of multiple layers of material, such as, for example, the depicted silicon dioxide layer 104A and the silicon nitride layer 104B. Thus, the particular form and composition of the patterned fin-formation etch mask 104 should not be considered a limitation of the presently disclosed inventions.

The lateral width and vertical height of the fins 106 may vary depending upon the particular application. Additionally, the overall size, shape and configuration of the fin-formation trenches 105 and the fins 106 may vary depending on the particular application. In the illustrative examples depicted in the attached drawings, the fin-formation trenches 105 and the fins 106 are all depicted as having a uniform size and shape. However, such uniformity in the size and shape of the trenches 105 and the fins 106 is not required to practice at least some aspects of the inventions disclosed herein. In the attached figures, the fin-formation trenches 105 are depicted as having been formed by performing an anisotropic etching process that results in the fins 106 having a schematically (and simplistically) depicted, generally rectangular configuration. In an actual real-world device, the sidewalls of the fins 106 may be somewhat outwardly tapered (i.e., the fins may be wider at the bottom of the fin than they are at the top of the fin) although that configuration is not depicted in the attached drawings. Thus, the size and configuration of the fin-formation trenches 105 and the fins 106, and the manner in which they are made, should not be considered a limitation of the presently disclosed inventions. For ease of disclosure, only the substantially rectangular trenches 105 and fins 106 will be depicted in the subsequent drawings.

Figure 3:
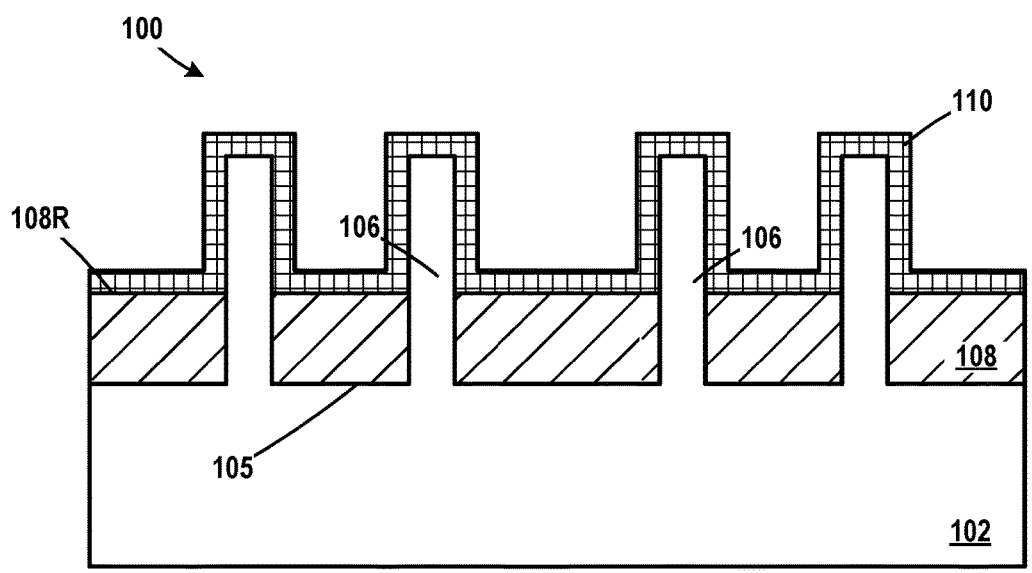

FIG. 3 depicts the product 100 after several process operations were performed. First, a layer of insulating material 108, such as silicon dioxide, was deposited so as to overfill the trenches 105 such that insulating material 108 was positioned above the upper surface of the patterned etch mask 104. Thereafter, a CMP process was performed to planarize the upper surface of the deposited layer of insulating material 108 with the upper surface of the patterned etch mask 104. Then, a recess etching process was performed to recess the layer of insulating material 108 such that it has a recessed upper surface 108R that exposes a portion of the vertical height of the fins 106. The amount of recessing of the layer of insulating material 108 may vary depending upon the particular application. Thereafter, one or more etching processes were performed to remove the patterned etch mask 104 relative to the surrounding materials.

As noted above, the gate structures for the transistor devices will be manufactured using a unique replacement gate manufacturing process disclosed herein. Accordingly, still referencing FIG. 3, a conformal deposition process, e.g., a conformal ALD process, was performed to form a conformal sacrificial gate insulation layer 110 on the product 100. Alternatively, the conformal sacrificial gate insulation layer 110 could also be formed by performing a thermal growth process. The thickness and material of construction for the sacrificial gate insulation layer 110 may vary depending upon the particular application. In one illustrative embodiment, the sacrificial gate insulation layer 110 may be comprised of silicon dioxide. In the depicted example, wherein the illustrative transistor devices are FinFET devices, a conformal deposition process was performed to form the sacrificial gate insulation layer 110. However, the formation of such a conformal sacrificial gate insulation layer 110 may not be required in all applications. For example, when the transistor devices are planar devices, the sacrificial gate insulation layer 110 may be formed by forming a non-conformal deposition process or a thermal growth process.

Figure 4:
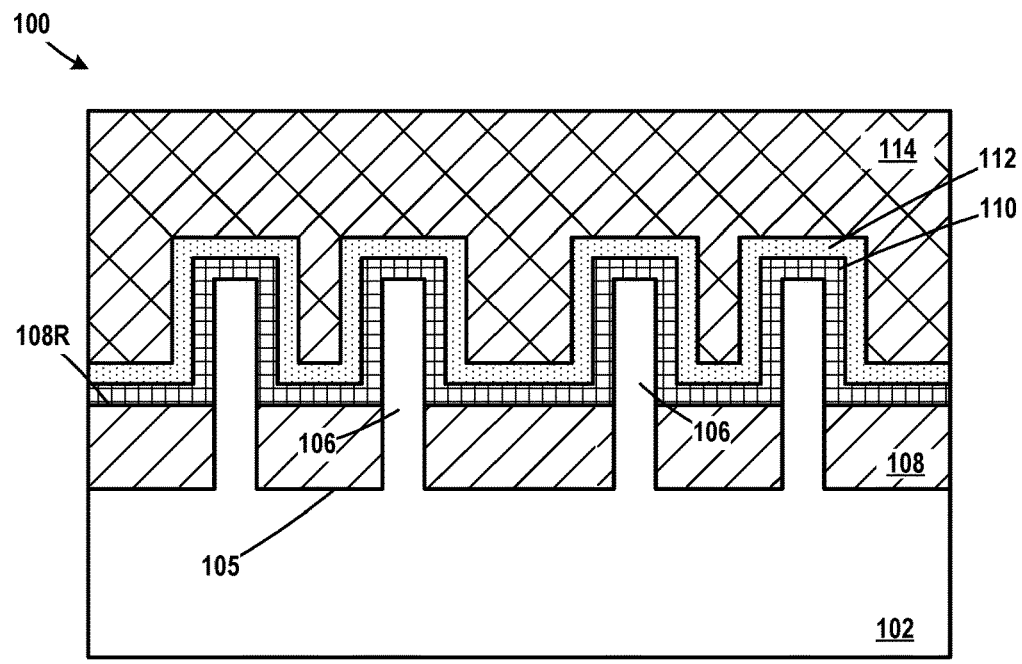

In the examples depicted herein, the sacrificial gate electrode of the sacrificial gate structure for the devices will be comprised of at least two different layers of sacrificial material that will be formed above the sacrificial gate insulation layer 110. These at least two different layers of sacrificial material will be made of materials that may be selectively etched relative to one another. Accordingly, FIG. 4 depicts the product 100 after several process operations were performed. First, another conformal deposition process was performed to form a conformal first sacrificial gate electrode material layer 112 on the sacrificial gate insulation layer 110. The thickness and material of construction of the conformal first sacrificial gate electrode material layer 112 may vary depending upon the particular application. For example, the conformal first sacrificial gate electrode material layer 112 should be made of a material that will exhibit a significant etch selectivity relative to another layer of material for the sacrificial gate structure (described below) that will be formed above the conformal first sacrificial gate electrode material layer 112. The conformal first sacrificial gate electrode material layer 112 should be made of a material that will exhibit good etch selectivity to the underlying sacrificial gate insulation layer 110. In one illustrative example, the conformal first sacrificial gate electrode material layer 112 may be comprised of silicon germanium, etc. In the depicted example, wherein the illustrative transistor devices are FinFET devices, a conformal deposition process was performed to form the conformal first sacrificial gate electrode material layer 112. However, the formation of such a conformal first sacrificial gate electrode material layer 112 may not be required in all applications. For example, when the transistor devices are planar devices, the first sacrificial gate electrode material layer 112 may be formed by forming a non-conformal deposition process.

With continuing reference to FIG. 4, after formation of the conformal first sacrificial gate electrode material layer 112, a blanket deposition process was performed to form a second sacrificial gate electrode material layer 114 on the conformal first sacrificial gate electrode material layer 112. As noted above, the second sacrificial gate electrode material layer 114 should be made of a material that exhibits good etch selectivity relative to the underlying conformal first sacrificial gate electrode material layer 112. In one illustrative example, the second sacrificial gate electrode material layer 114 may be comprised of polysilicon, amorphous silicon, etc. Although not depicted in the drawings, after the second sacrificial gate electrode material layer 114 is initially deposited, its upper surface may be uneven, as it will tend to have high spots at locations above the fins 106 and low spots in areas between the fins 106, i.e., its upper surface will comprise peaks and valleys. Ultimately, it is desirable that the upper surface of the second sacrificial gate electrode material layer 114 be substantially planar prior to performing additional process operations. In one embodiment, this may be accomplished by forming a relative thin layer of silicon dioxide so as to overfill the valleys in the upper surface of the second sacrificial gate electrode material layer 114, performing a CMP process to planarize the upper surfaces of the silicon dioxide and second sacrificial gate electrode material layer 114, and thereafter performing an etching process that is non-selective relative to the layer of silicon dioxide and the material of the second sacrificial gate electrode material layer 114. This etching process is performed until all of the silicon dioxide material is removed, thereby leaving the second sacrificial gate electrode material layer 114 with the substantially planar upper surface depicted in FIG. 4. As will be appreciated by those skilled in the art after a complete reading of the present application, the sacrificial gate structures disclosed herein comprise at least three sacrificial layers of material: the layers 110, 112 and 114. Up to the point of processing depicted in FIG. 4, all of the layers of material 110, 112 and 114 have been formed across the entire substrate 102.

Figure 5:
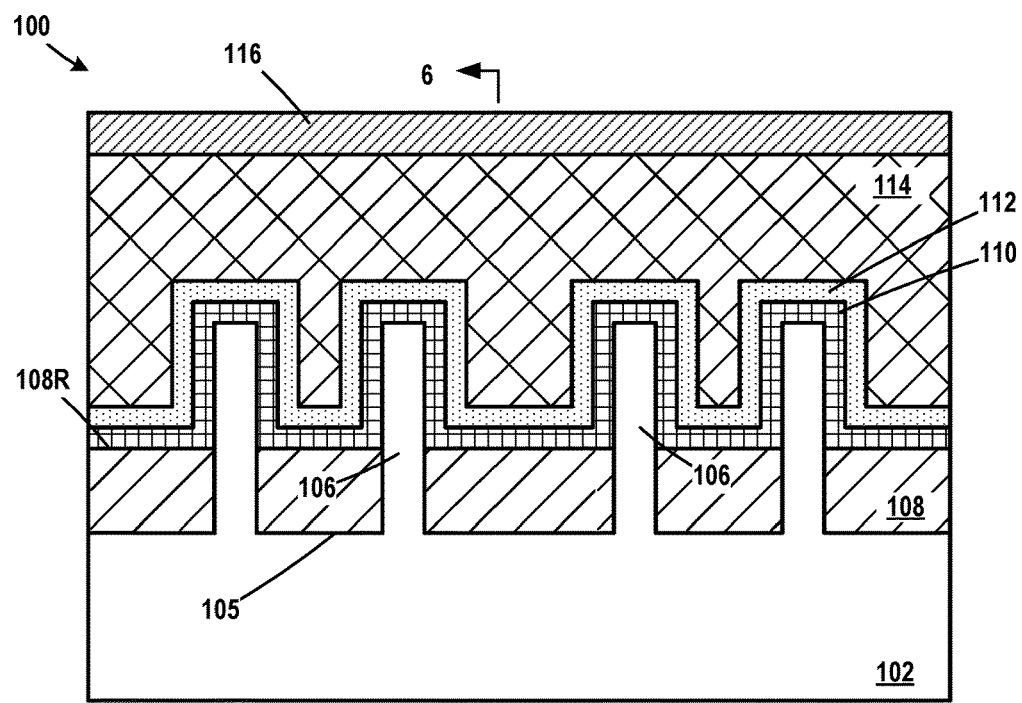
Figure 6:
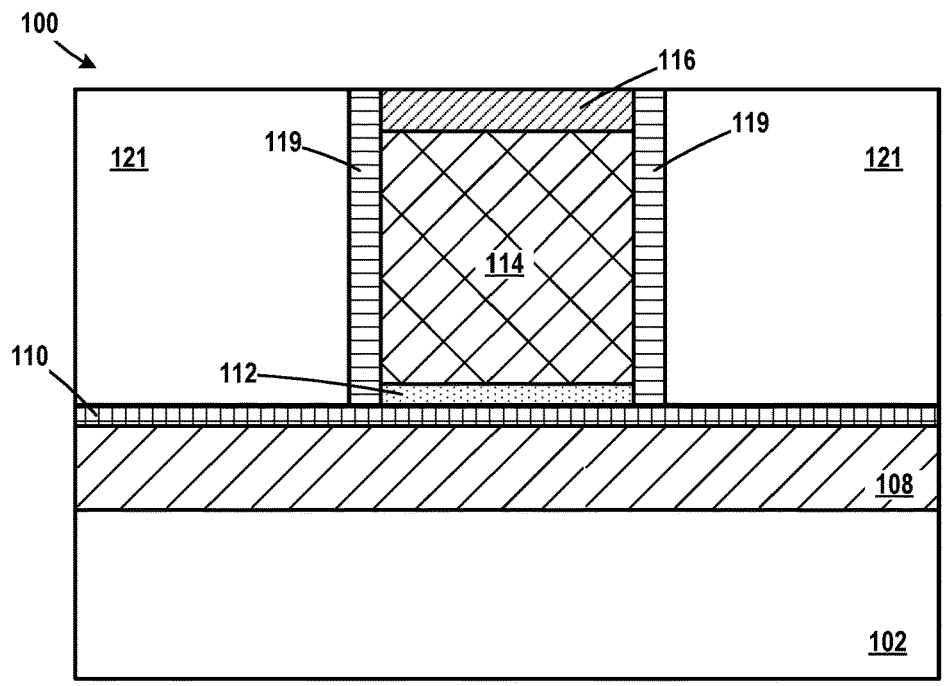

FIGS. 5 and 6 depict the product after several process operations were performed. FIG. 6 is a cross-sectional view taken where indicated in FIG. 5 in a direction corresponding to the gate length (current transport) direction of the transistor devices. At this point in the illustrative process flow depicted herein, a plurality of etching processes will be performed to pattern at least the layers 112 and 114 (that collectively comprise the sacrificial gate electrode) so as to form a plurality of continuous line-type structures that extend across the substrate 102. In some applications, the layer 110 may also be patterned at this point in the process flow, but such a situation is not depicted in the drawings. This may be accomplished by forming a patterned etch mask 116, e.g., a patterned layer of silicon nitride, that is comprised of a plurality of line-type features above the layer 114 and thereafter performing one or more etching processes through the patterned etch mask 116 to remove the exposed portions of at least the layers of material 114 and 112. The patterned etch mask 116 may be formed using traditional photolithography and etching processes. Each of the individual features of the patterned etch mask 116 may serve as a gate cap for one of the continuous line-type sacrificial gate structures comprised of the layers 114, 112 and perhaps 110 after the completion of the etching processes. Then, as shown in FIG. 6, a sidewall spacer 119 may be formed adjacent the sidewalls of the continuous line-type sacrificial gate structures by performing traditional spacer manufacturing techniques, i.e., depositing a conformal layer of spacer material and performing an anisotropic etching process. With reference to FIG. 6, a layer of insulating material 121, e.g., silicon dioxide, is then deposited on the product 100 and a CMP process is performed to planarize the upper surface of the layer of insulating material 121 with the upper surface of the gate cap 116.

Figure 7:
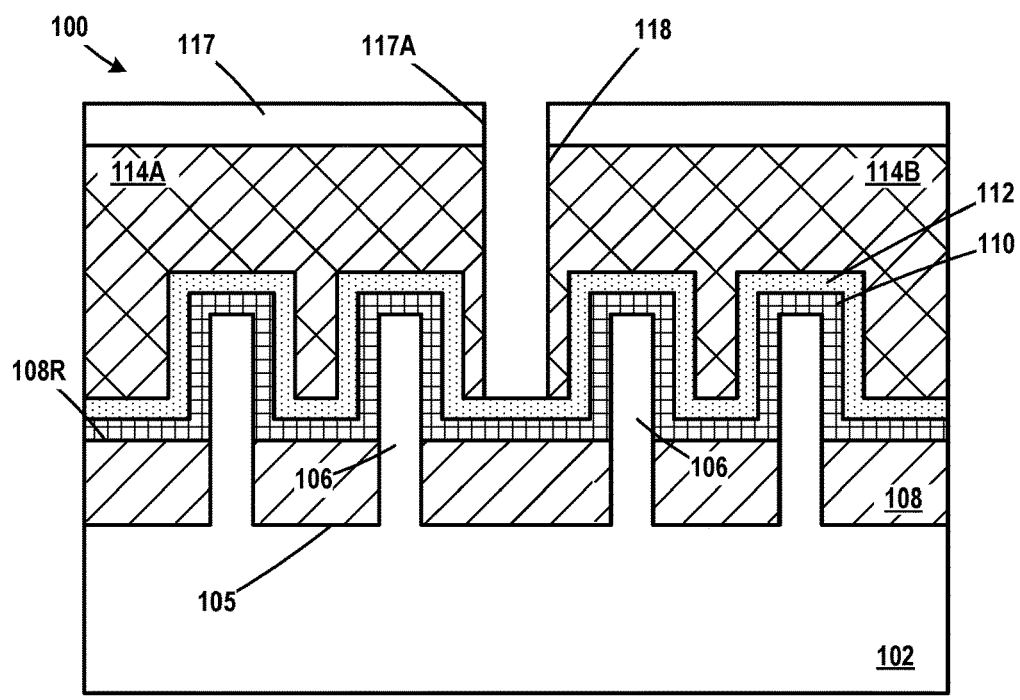

FIG. 7 depicts the product 100 after several process operations were performed. First, the gate cap layer 116 was removed by performing an etching process. Then, a CMP process was performed to planarize the upper surface of the layer of insulating material 121 with the sacrificial gate structure material layer 114. Alternatively, a CMP process could be performed to remove the gate cap 116 and portions of the insulating material 121, wherein the sacrificial gate structure material layer 114 serves as a polish-stop. At that point, a patterned mask layer 117, e.g., a patterned layer of photoresist, with an opening 117A formed therein, was formed above the second sacrificial gate electrode material layer 114. The opening 117A is positioned at a location where it is desired to cut or remove the materials of the sacrificial gate structure. With continuing reference to FIG. 7, a first anisotropic etching process was performed through the opening 117A to remove exposed portions of the second sacrificial gate electrode material layer 114. In one illustrative embodiment, this first etching process stops on the conformal first sacrificial gate electrode material layer 112 (due to the etch selectivity between the layers 112 and 114) and forms a second layer opening 118 that extends through the second sacrificial gate electrode material layer 114.

Figure 8:
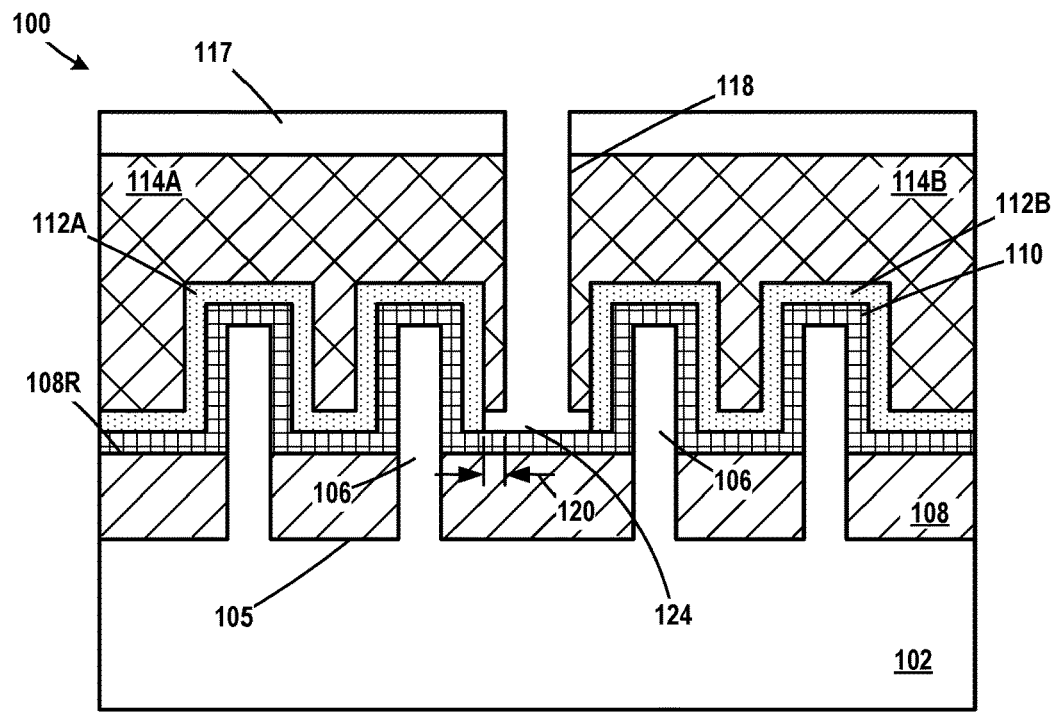

FIG. 8 depicts the product 100 after a second etching process, e.g., an isotropic etching process, was performed through the second layer opening 118 to remove portions of the conformal first sacrificial gate electrode material layer 112 selectively relative to the second sacrificial gate electrode material layer 114 and the sacrificial gate insulation layer 110. This process forms a first layer opening 124 in the first sacrificial gate electrode material layer 112. As depicted, due to the isotropic nature of the etching process, some portion of the conformal first sacrificial gate electrode material layer 112 positioned vertically under the second sacrificial gate electrode material layer 114 may be removed, i.e., this etching process may result in some undercutting, as reflected by the dimension 120. The amount of such undercutting may vary depending upon the particular application (e.g., 3-5 nm). In other embodiments, in lieu of performing an isotropic etching process, an anisotropic etching process may be performed to remove the portion of the conformal first sacrificial gate electrode material layer 112 exposed by the second layer opening 118. In that case, the edges of the conformal first sacrificial gate electrode material layer 112 would be substantially self-aligned with the second layer opening 118 after the etching process is completed. At the completion of the etching process (either isotropic or anisotropic), the second sacrificial gate electrode material layer 114 is cut into a first portion 114A and a second portion 114B, and the conformal first sacrificial gate electrode material layer 112 is cut into a first portion 112A and a second portion 112B. Additionally, if desired, the exposed portions of the sacrificial layer of gate insulation material 110 may be removed by performing an etching process, although such a situation is not depicted in the drawings.

Figure 9:
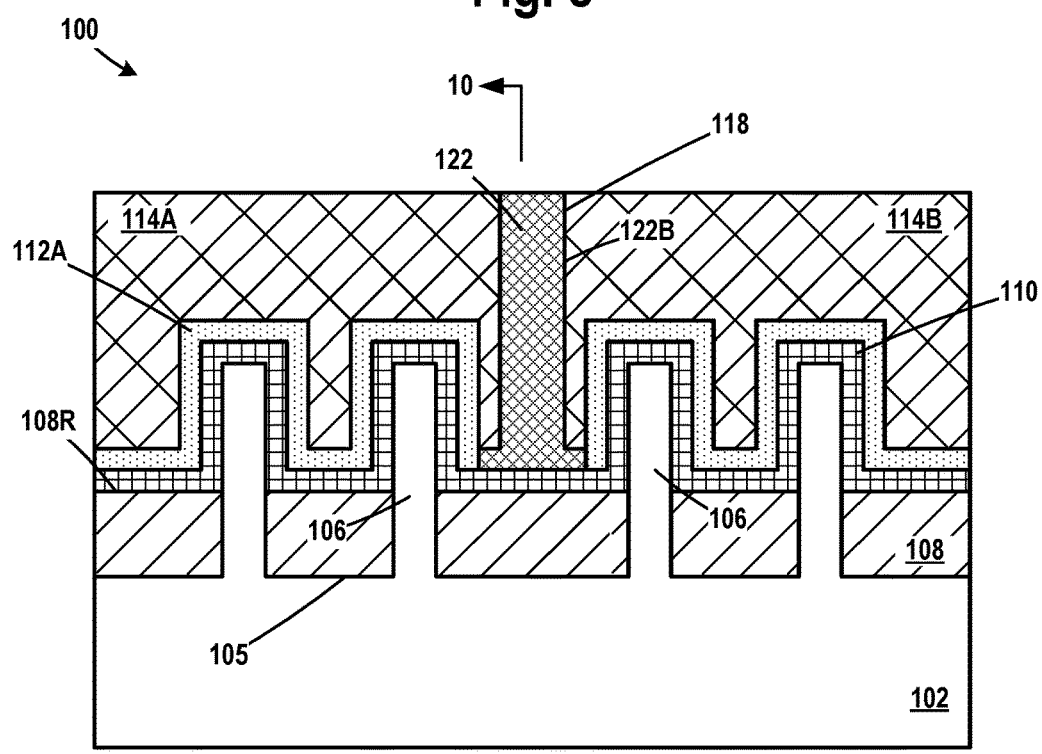
Figure 10:
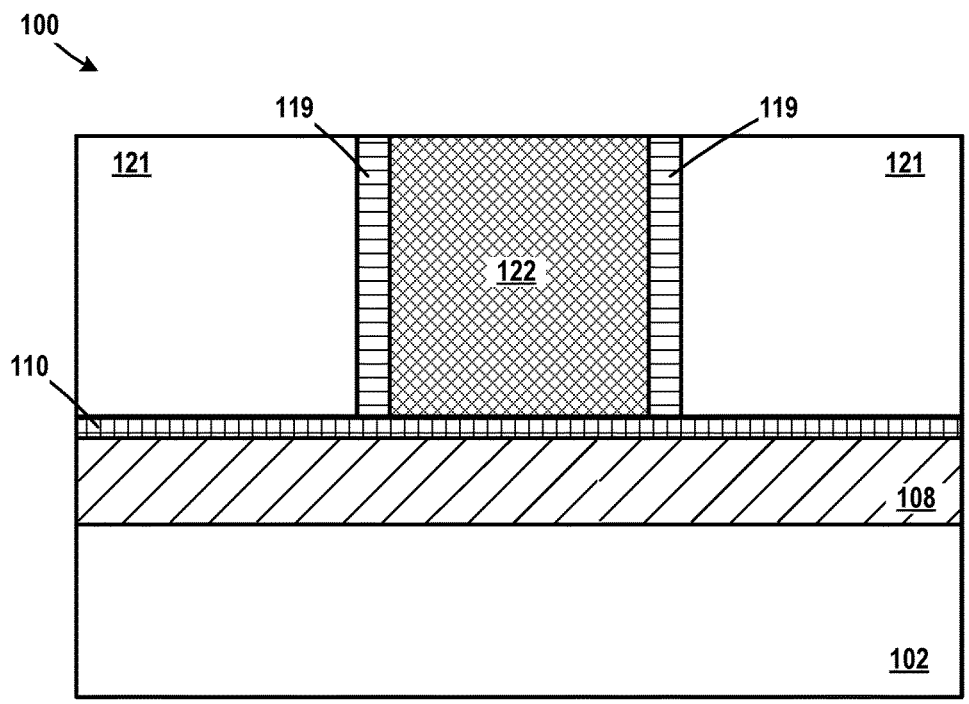

FIGS. 9 and 10 depict the product after several process operations were performed. FIG. 10 is a cross-sectional view taken where indicated in FIG. 9 in a direction corresponding to the gate length (current transport) direction of the transistor devices. First, the patterned etch mask 117 was removed. Thereafter, a deposition process was performed so as to overfill the second layer opening 118 and the first layer opening 124 with an insulating material 122, e.g., silicon nitride. Thereafter, one or more CMP process operations were performed that stop on the upper surface of the second sacrificial gate electrode material layers 114A, 114B. This process operation removes excess amounts of the insulating material 122. The remaining insulating material 122 in the second layer opening 118 and the first layer opening 124 constitutes an insulating gate separation structure 122 having first and second opposing side surfaces 122A, 122B, respectively, when viewed in a cross-section taken in the gate width direction of the devices. Note that the materials of the sacrificial gate structure on opposite sides of the insulating gate separation structure 122 are now exposed for removal. Also note that, due to the undercutting 120 (see FIG. 8) when the first layer opening 124 was formed by performing an isotropic etching process, the insulating gate separation structure 122 has a inverted T-shaped cross-sectional configuration in a cross-sectional view taken through the insulating gate separation structure 122 in a direction corresponding to the gate width direction of the transistor device, as shown in FIG. 9, i.e., the very lower portion of the insulating gate separation structure 122 is outwardly flared relative to the cross-sectional configuration right above the outwardly flared lower portion. That is, in the view shown in FIG. 9, the insulating gate separation structure 122 has a greater width at its bottom that it does at its upper surface. However, since the insulating gate separation structure 122 is laterally bounded by the spacer 119 in the gate length direction of the device, this additional width or outward flaring of the lower portion of the insulating gate separation structure 122 is not present at the bottom of the insulating gate separation structure 122 in the cross-sectional view shown in FIG. 10.

Figure 11:
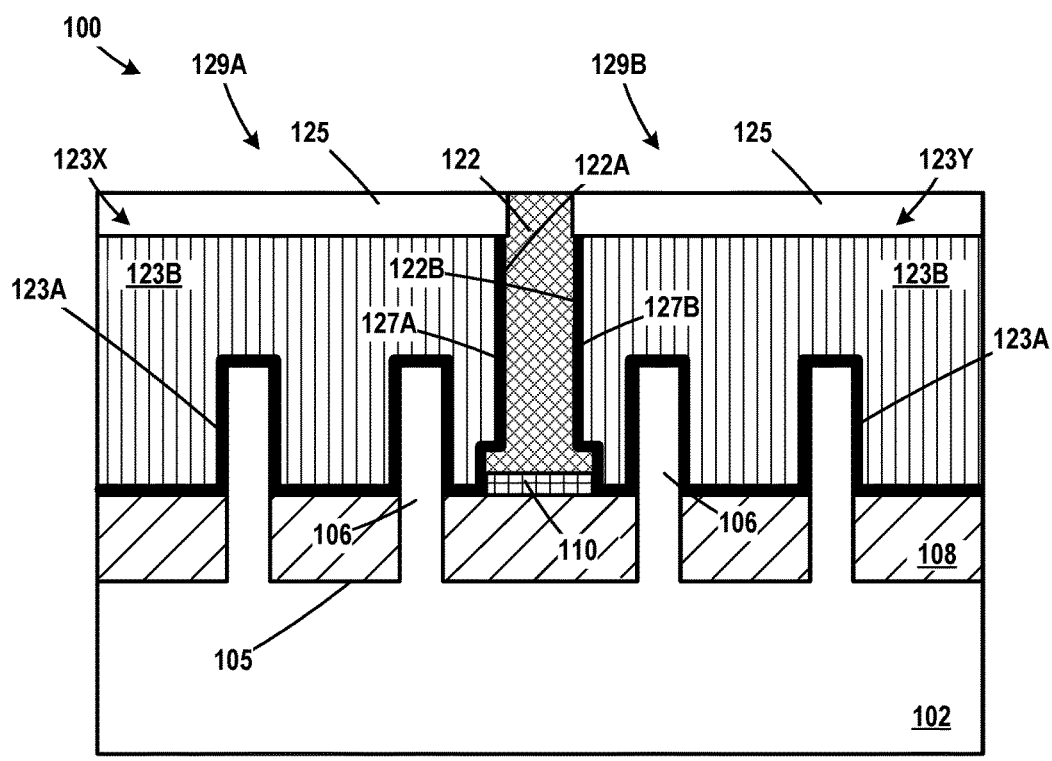

FIG. 11 depicts the product 100 after several process operations were performed to form final first and second replacement gate structures 123X, 123Y (collectively referenced using the reference numeral 123) on opposite sides of the insulating gate separation structure 122 for the transistor devices. First, a plurality of etching processes was performed to sequentially remove the exposed portions of the layers 114, 112 and the sacrificial gate insulation layer 110. This process operation defines a plurality of replacement gate cavities 129A, 129B on opposite sides of the insulating gate separation structure 122. The gate cavities 129A, 129B are laterally bounded (in the gate length direction) by the sidewall spacer 119 (see FIG. 10). Next, various process operations were performed to form illustrative and simplistically depicted replacement gate structures 123X, 123Y in each of the gate cavities 129A, 129B, respectively. In general, the replacement gate structure 123 may be comprised of one or more layers of insulating material that serve (in whole or part) as the gate insulation layer of the final gate structure for the transistor devices, and one or more layers of conductive material, e.g., a metal, a metal alloy, polysilicon, a work-function adjusting metal, etc., that function (in whole or part) as the conductive gate electrode of the final gate structure of the transistor devices. In the example depicted herein, the illustrative replacement gate structure 123 comprises an illustrative gate insulation layer 123A and a conductive gate electrode 123B. The thickness and composition of the materials for the replacement gate structure 123 may vary depending upon the particular application, and the relative thickness of the materials for the replacement gate structure 123 shown in the drawings is not to scale. In one illustrative example, the same materials for the replacement gate structure 123 may be used for the gate structure for both N- and P-type devices. In other applications, by formation of appropriate masking layers (not shown), the materials for the replacement gate structure 123 used for N- and P-type devices may be different. In one illustrative embodiment, the layer of insulating material 123A may be made of a high-k (k value of 10 or greater) insulating material, such as hafnium oxide, while the conductive gate electrode 123B may be comprised of a metal or a metal-containing material such as titanium nitride (not separately shown) that functions as a work-function adjusting layer, and a bulk layer of conductive material such as a metal, a metal alloy, tungsten or a doped polysilicon. As will be appreciated by those skilled in the art after a complete reading of the present application, the replacement gate structure 123 is intended to be representative of any type of gate structure that may be formed using replacement gate manufacturing techniques. It should be noted that the first final gate structure 123X has a first end surface 127A that contacts the first side surface 122A of the insulating gate separation structure 122, while the second final gate structure 123Y has a second end surface 127B that contacts the second side surface 122B of the insulating gate separation structure 122. Additionally, a bottom portion of the insulating gate separation structure 122 has a first portion that is positioned vertically under a portion of the first final gate structure 123X and a second portion that is positioned vertically under a portion of the second final gate structure 123Y.

In one illustrative process flow, after formation of the materials for the replacement gate structure 123, a CMP process may be performed to remove excess materials positioned above the layer of insulating material 121 (see FIG. 10). At that point, one or more recess etching processes may be performed to remove portions of, or recess, the materials of the replacement gate structure 123 within the gate cavities 129A, 129B to make room for a final gate cap 125. The final gate cap 125 (e.g., silicon nitride) may be formed by depositing a layer of the gate cap material so as to overfill the gate cavities 129A, 129B and thereafter performing a CMP process to remove excess materials.

Figure 12:
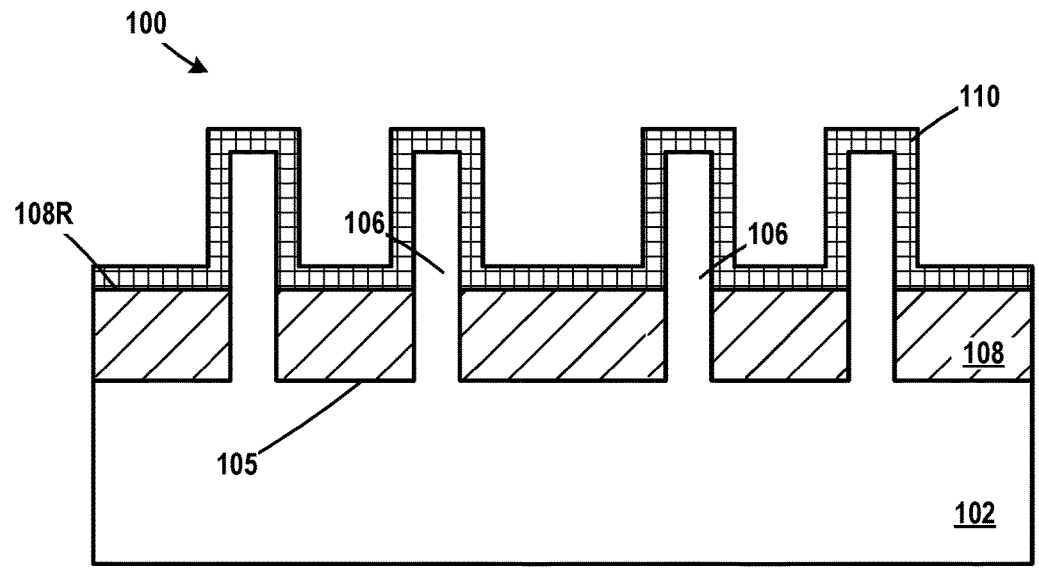

FIGS. 12-21 depict other novel methods disclosed herein related to the formation of replacement gate structures on transistor devices and the resulting device structures. FIG. 12 depicts the product 100 at a point in processing that corresponds to that shown in FIG. 3, i.e., after the formation of the conformal sacrificial gate insulation layer 110.

Figure 13:
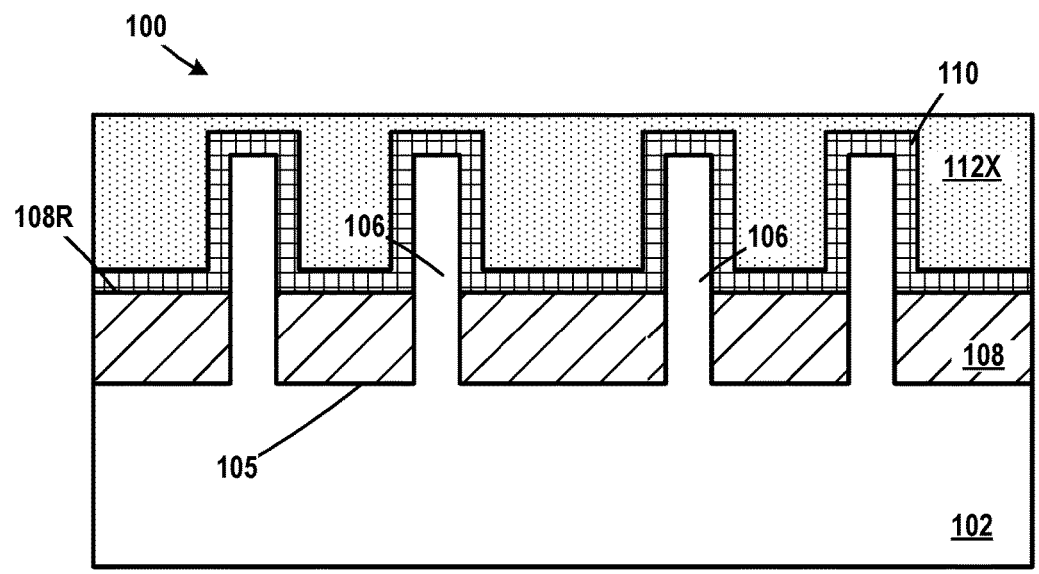

FIG. 13 depicts the product after a blanket-deposition process was performed to form a non-conformal first sacrificial gate electrode material layer 112X. The non-conformal first sacrificial gate electrode material layer 112X may be comprised of the same material as that of the above-described conformal first sacrificial gate electrode material layer 112. Although not depicted in the drawings, after the non-conformal first sacrificial gate electrode material layer 112X is initially deposited, its upper surface may be uneven as it will tend to have high spots at locations above the fins 106 and low spots in areas between the fins 106, i.e., its upper surface may comprise peaks and valleys. The upper surface of the non-conformal first sacrificial gate electrode material layer 112X may be planarized using the procedure described above with respect to the planarization of the second sacrificial gate electrode material layer 114.

Figure 14:
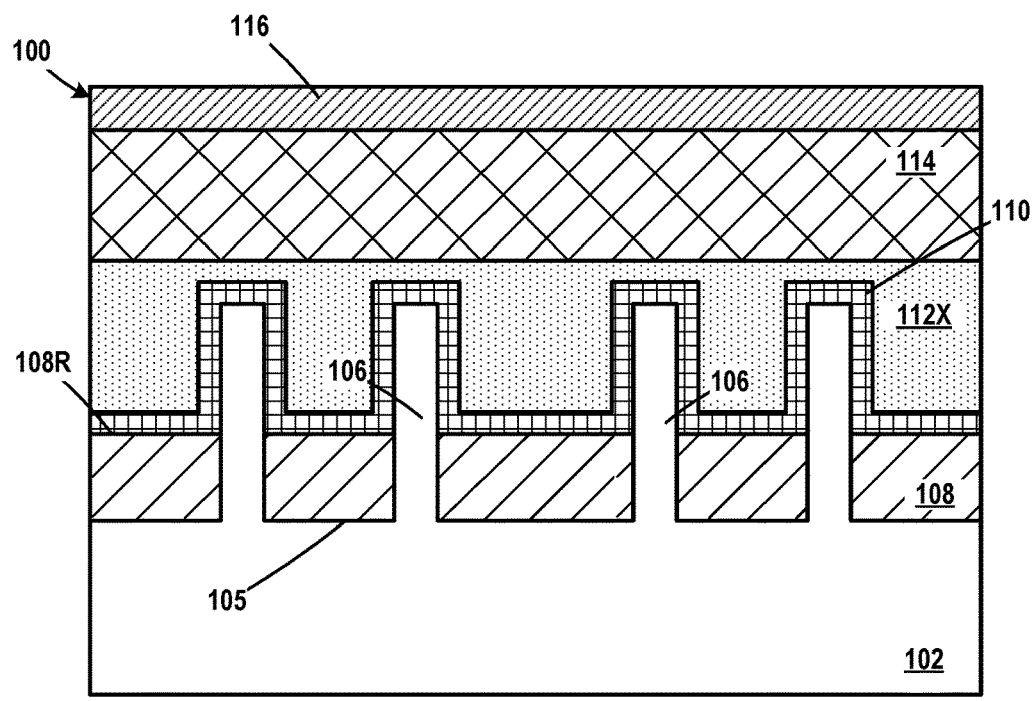

FIG. 14 depicts the product 100 after several process operations were performed. First, the above-described second sacrificial gate electrode material layer 114 was formed above the non-conformal first sacrificial gate electrode material layer 112X. At that point, in accordance with the process flow discussed in connection with FIGS. 5 and 6, at least the layers 112X and 114 were patterned into a plurality of continuous line-type structures by performing one or more etching processes though the above-described patterned etch mask 116. Thereafter, the sidewall spacer 119 (see FIG. 6) was formed adjacent the continuous line-type features, and the layer of insulating material 121 (see FIG. 6) was formed on the product as described above.

Figure 15:
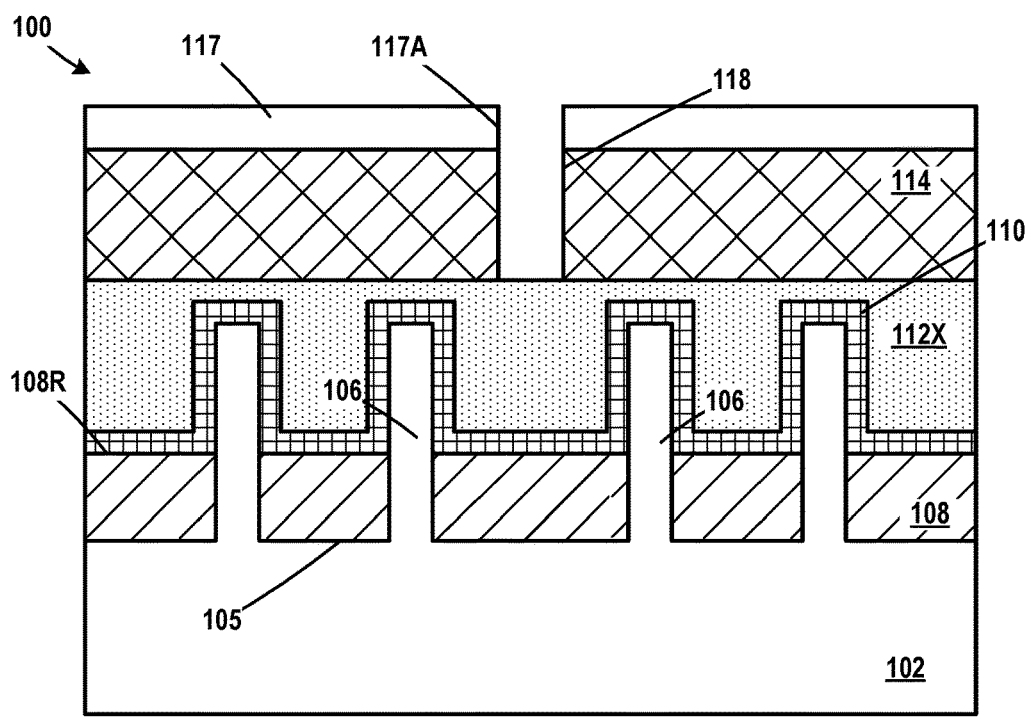

FIG. 15 depicts the product 100 after several process operations were performed. First, the gate caps 116 were removed by performing the process operations discussed above in connection with FIG. 7. At that point, the above-described patterned mask layer 117, with the opening 117A formed therein, was formed above the second sacrificial gate electrode material layer 114. As before, the opening 117A is positioned at a location where it is desired to cut or remove the materials of the sacrificial gate structures. With continuing reference to FIG. 14, one or more anisotropic etching processes were performed through the opening 117A to remove the exposed portion of the second sacrificial gate electrode material layer 114. This etching process stops on the non-conformal first sacrificial gate electrode material layer 112X (due to the etch selectivity between the materials selected for the layers 112X and 114) and forms a second layer opening 118 that extends through the second sacrificial gate electrode material layer 114.

Figure 16:
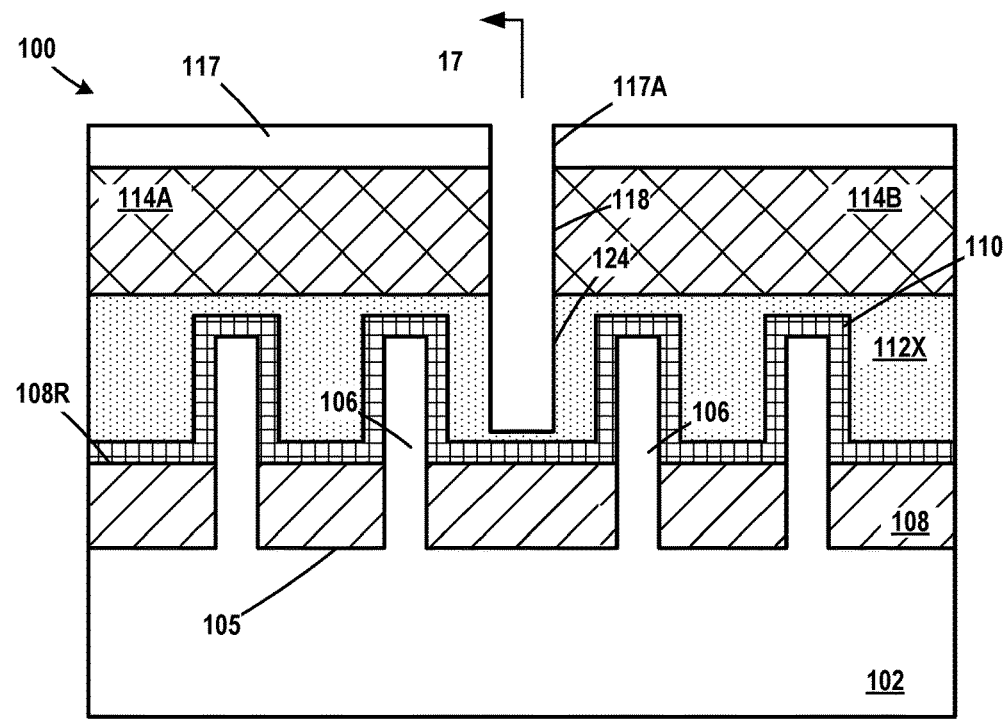
Figure 17:
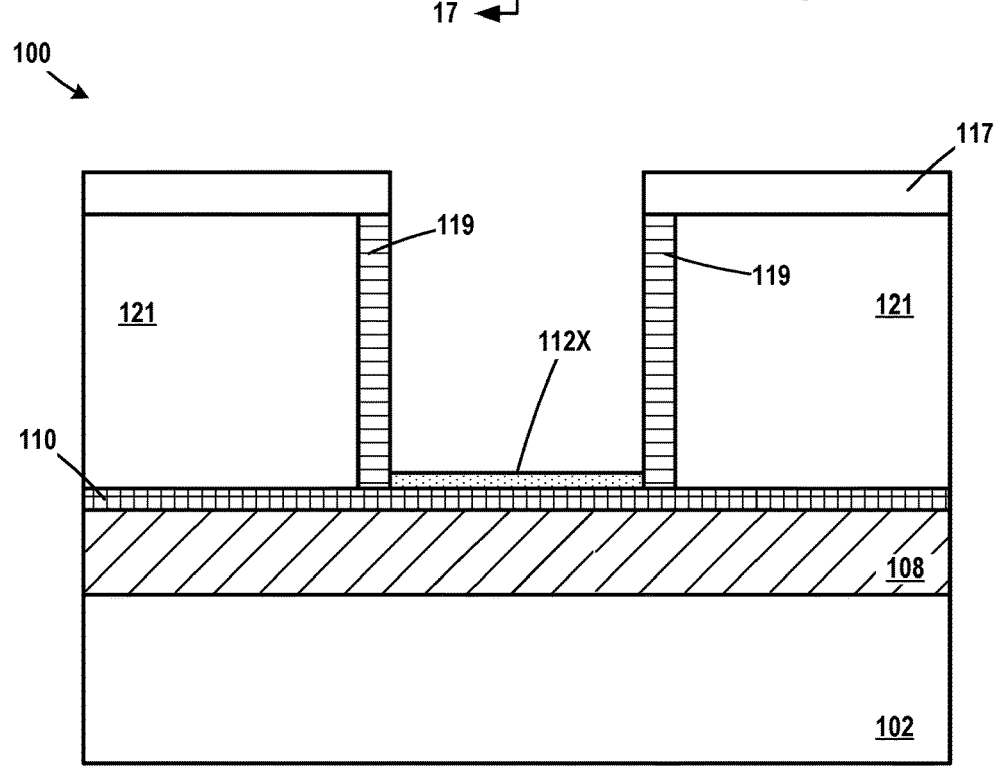

FIGS. 16 and 17 depict the product 100 after several process operations were performed. FIG. 17 is a cross-sectional view taken where indicated in FIG. 16 in a direction corresponding to the gate length (current transport) direction of the transistor devices. FIG. 16 depicts the product 100 after a timed anisotropic etching process was performed through the second layer opening 118 to remove portions of the non-conformal first sacrificial gate electrode material layer 112X. This etching process forms an opening or recess 124 in the non-conformal first sacrificial gate electrode material layer 112X that, in one embodiment, does not extend through the entire thickness of the non-conformal first sacrificial gate electrode material layer 112X. The depth of the first layer opening or recess 124, as well as the amount of the material of the non-conformal first sacrificial gate electrode material layer 112X that remains positioned at the bottom of the first layer opening or recess 124 may vary depending upon the particular application. FIG. 17 depicts the above-described sidewall spacer 119 that was initially formed adjacent the patterned layers of material 112X and 114. Also depicted in FIG. 17 is the above-described layer of insulating material 121, e.g., a layer of silicon dioxide.

Figure 18:
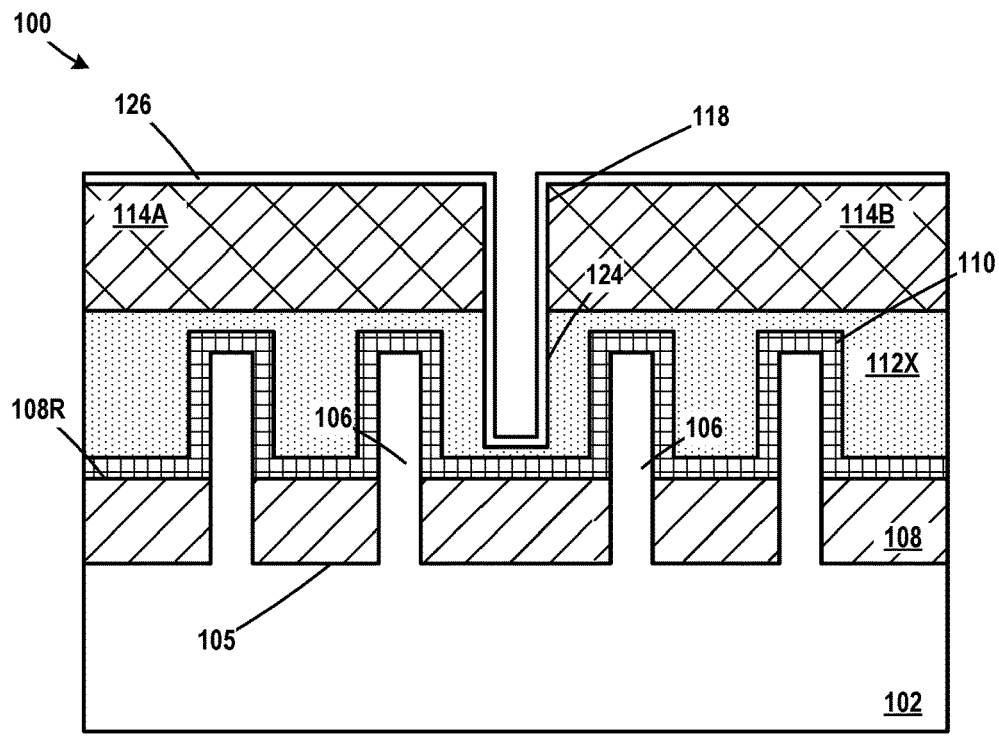

FIG. 18 depicts the product 100 after several process operations were performed. First, the patterned etch mask 117 was removed. Thereafter, a conformal deposition process was performed to form a conformal layer of spacer material 126 above the layers 114A, 114B and in the openings 118 and 124. The layer of spacer material 126 may be made of any desired material, e.g., silicon nitride, silicon oxynitride, etc.

Figure 19:
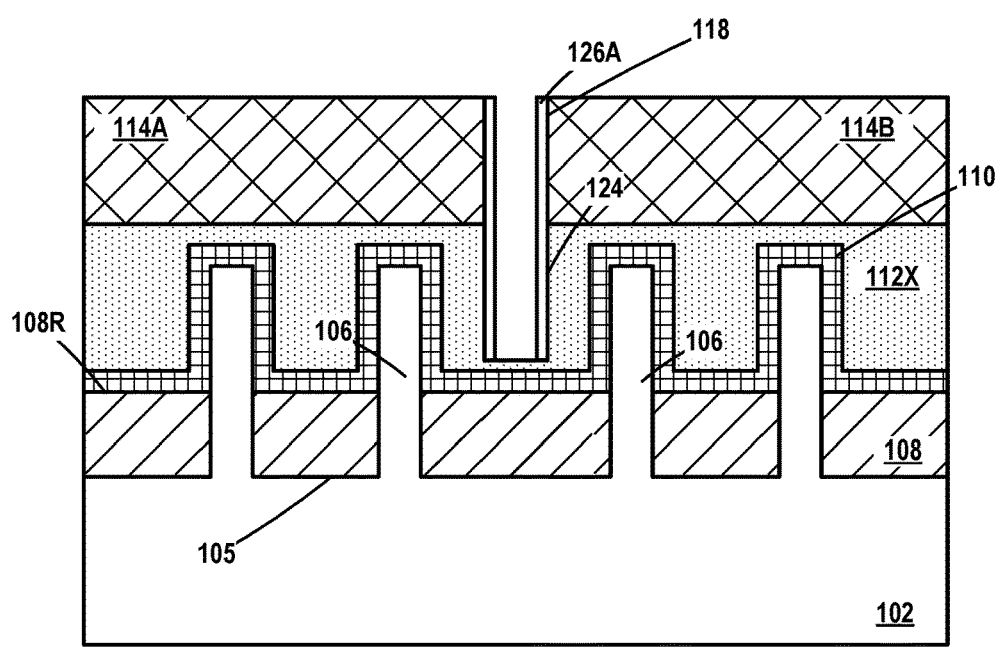

FIG. 19 depicts the product 100 after an anisotropic etching process was performed to remove the horizontally positioned portions of the layer of spacer material 126, thereby forming an internal sidewall spacer 126A positioned on the sidewalls of the openings 118 and 124. By forming the internal spacer 126A, the residual portion of the non-conformal first sacrificial gate electrode material layer 112X positioned at the bottom of the first layer opening 124 is again exposed.

Figure 20:
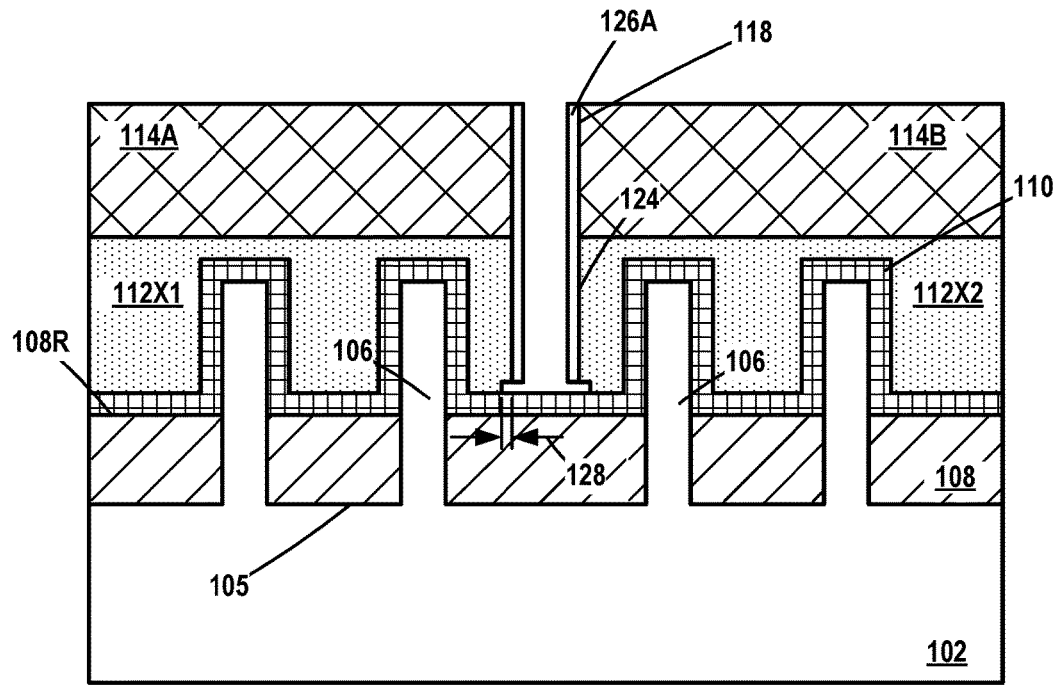

FIG. 20 depicts the product after an isotropic etching process was performed through the openings 118 and 124 to remove the residual portions of the non-conformal first sacrificial gate electrode material layer 112X selectively relative to the sacrificial gate insulation layer 110. As depicted, due to the isotropic nature of the etching process, some portion of the non-conformal first sacrificial gate electrode material layer 112X positioned vertically under at least the internal spacer 126A may be removed, i.e., this etching process may result in some undercutting, as reflected by the dimension 128. The amount of such undercutting may vary depending upon the particular application (e.g., 3-5 nm). At the completion of the etching process, the second sacrificial gate electrode material layer 114 is cut into a first portion 114A and a second portion 114B, and the conformal first sacrificial gate electrode material layer 112X is cut into a first portion 112X1 and a second portion 112X2. As before, as this point in the process flow, if desired, the exposed portions of the sacrificial gate insulation layer 110 may be removed by performing an etching process.

Figure 21:
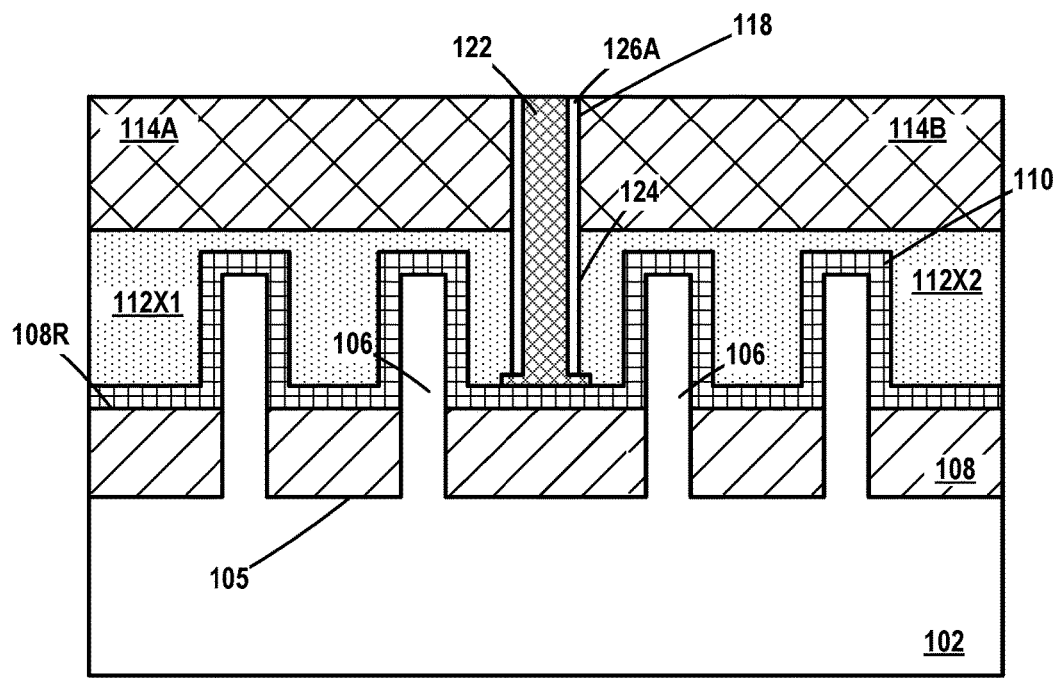

FIG. 21 depicts the product after a deposition process was performed so as to overfill the openings 118 and 124 with the above-described insulating material 122, e.g., silicon nitride. Thereafter, one or more CMP process operations were performed that stop on the upper surface of the second sacrificial gate structure material layers 114A, 114B so as to remove excess amounts of the insulating material 122. The remaining insulating material 122 in the second layer opening 118 constitutes the above-described insulating gate separation structure 122 with the inverted T-shape configuration. Note that the materials of the sacrificial gate structures on opposite sides of the insulating gate separation structure 122 are now exposed for removal. At this point, although not depicted in any drawings for this embodiment, the above-described process operations may be performed to remove the materials of the sacrificial gate structure and form the above-described replacement gate cavities 129A, 129B. At that point, the above-described replacement gate structures 123X, 123Y may be formed in the replacement gate cavities 129A, 129B, respectively.

Figure 22:
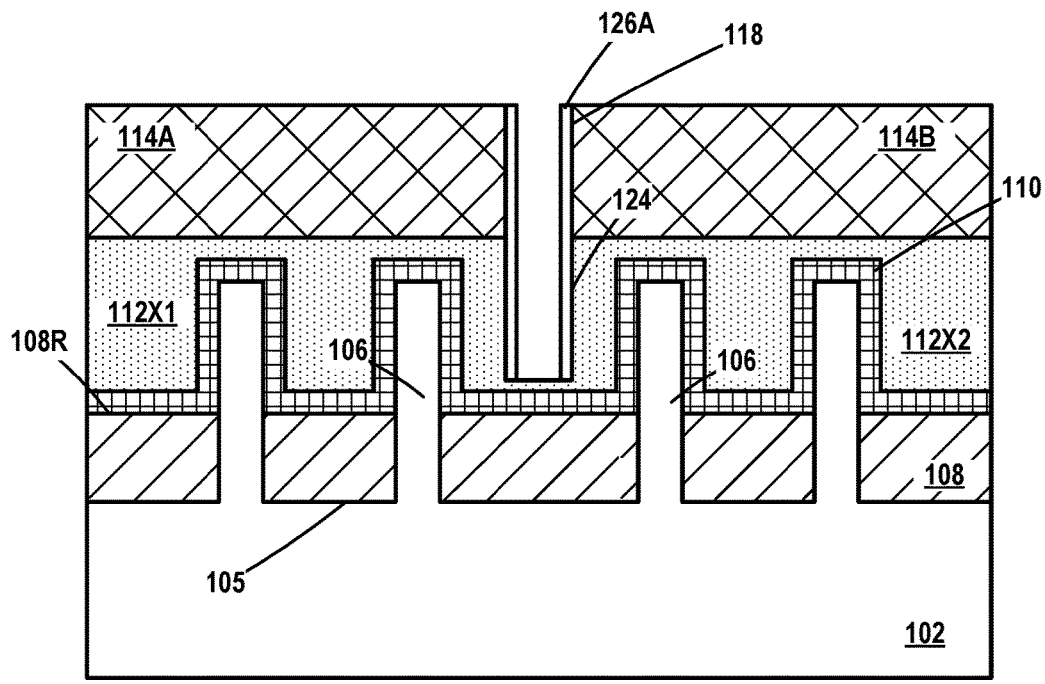
Figure 23:
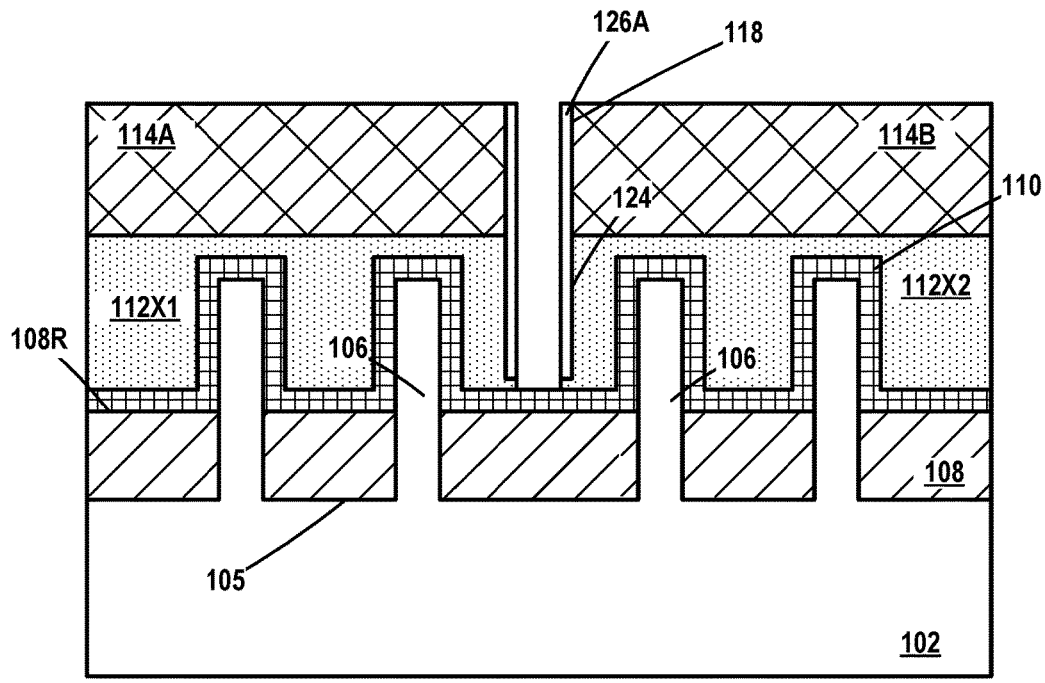
Figure 24:
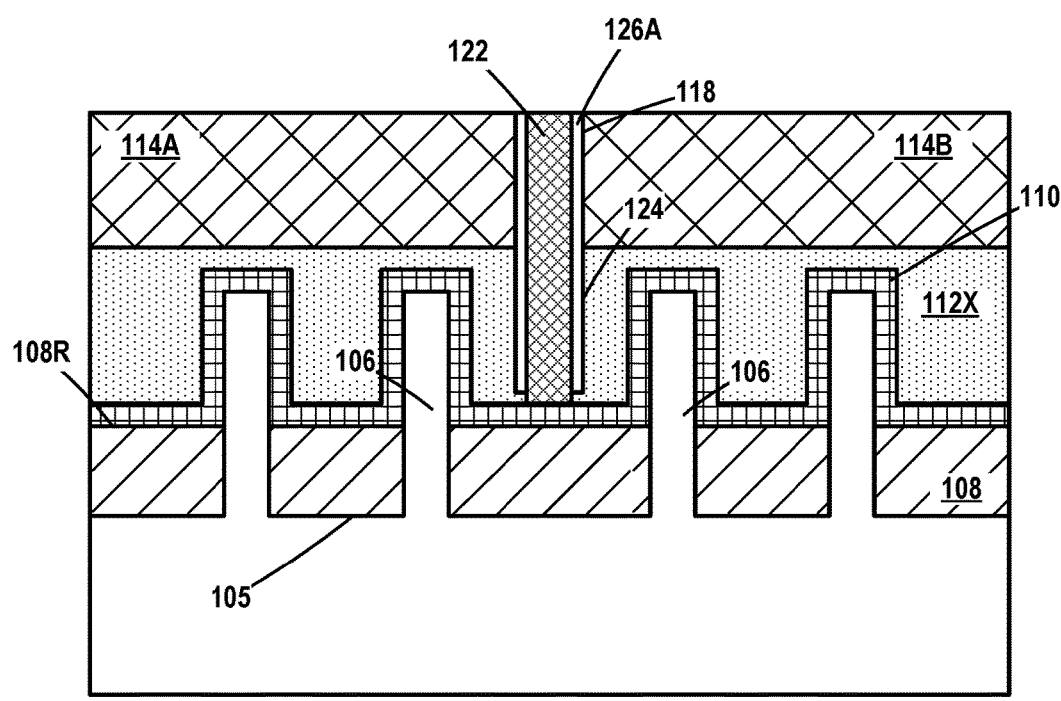

FIGS. 22-24 depict other novel methods disclosed herein related to the formation of replacement gate structures on transistor devices and the resulting device structures. FIG. 22 depicts the product at a point in fabrication that corresponds to that shown in FIG. 19, i.e., after the formation of the internal spacer 126A.

FIG. 23 depicts the product after several process operations were performed. First, an anisotropic etching process was performed to remove the portion of the non-conformal first sacrificial gate electrode material layer 112X1, 112X2 exposed by the formation of the internal spacer 126A. As depicted, the edge of the non-conformal first sacrificial gate electrode material layer 112X1, 112X2 is substantially self-aligned with the internal spacer 126A after the etching process is completed.

FIG. 24 depicts the product after the insulating gate separation structure 122 was formed in the openings 118 and 124 using the techniques described above in connection with FIG. 21. However, due to performing the anisotropic etching process, there is substantially no undercutting of the non-conformal first sacrificial gate electrode material layer 112X1, 112X2. As a result, in this embodiment, the insulating gate separation structure 122 does not have the above-described inverted-T shape configuration, i.e., it does not have the outwardly flared lower portion described above. Rather, in this embodiment, the insulating gate separation structure 122 has a substantially uniform configuration from the top of the insulating gate separation structure 122 to the bottom of the insulating gate separation structure 122. Of course, in stating that the insulating gate separation structure 122 has a substantially uniform configuration, it should be understood that the insulating gate separation structure 122 may have a larger width at its upper surface that it does at its bottom surface, i.e., there may be some degree of tapering from the top of the insulating gate separation structure 122 to the bottom of the insulating gate separation structure 122. At this point, the above-described process operations may be performed to remove the materials of the sacrificial gate structure and form the above-described replacement gate cavities 129A, 129B. Thereafter, the above-described replacement gate structures 123X, 123Y may be formed in the replacement gate cavities 129A, 129B, respectively.

As will be appreciated by those skilled in the art after a complete reading of the present application, several novel methods, devices and products are disclosed herein. As one example, one novel method disclosed herein includes forming a sacrificial gate structure above a semiconductor substrate 102, the sacrificial gate structure comprising a sacrificial gate insulation layer 110 and a multi-layer sacrificial gate electrode structure, (e.g., at least the layers 112 and 114) and removing the sacrificial gate structure to form a replacement gate cavity (e.g., 129) and forming a replacement gate structure (e.g., 123) in the replacement gate cavity.

Another illustrative method disclosed herein includes, among other things, forming a continuous line-type sacrificial gate structure above a semiconductor substrate by performing a method that includes forming a sacrificial gate insulation layer 110 above the semiconductor substrate 102, forming a first sacrificial gate electrode material layer 112 above the sacrificial gate insulation layer 110 and forming a second sacrificial gate electrode material layer 114 above the first sacrificial gate electrode layer 112. In this example, the method also includes removing a portion of the second sacrificial gate electrode material layer 114 and removing a portion of the first sacrificial gate electrode material layer 112 so as to thereby form a first opening (the combination of openings 118 and 124) positioned above the sacrificial gate insulation layer and forming an insulating gate separation structure 122 in the first opening. In this example, the method also includes removing materials of the sacrificial gate structure on opposite sides of the insulating gate separation structure 122 to form first and second replacement gate cavities 129A, 129B on opposite sides of the insulating gate separation structure 122 and forming first and second replacement gate structures 123X, 123Y in the first and second replacement gate cavities, respectively.

One illustrative integrated circuit product disclosed herein includes a first final gate structure 123X having a first end surface 127A and a second final gate structure 123Y having a second end surface 127B. In this embodiment, the integrated circuit product also includes an insulating gate separation structure 122 positioned between the first and second final gate structures, wherein the first end surface 127A contacts a first side surface 122A of the insulating gate separation structure 122 and the second end surface 127B contacts a second side surface 122Y of the insulating gate separation structure 122. In this embodiment, the insulating gate separation structure 122 has an inverted T-shaped cross-sectional configuration in at least one direction.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a continuous line-type sacrificial gate structure above a semiconductor substrate by performing a method that comprises:
  forming a sacrificial gate insulation layer above said semiconductor substrate;
  forming a first sacrificial gate electrode material layer above said sacrificial gate insulation layer; and
  forming a second sacrificial gate electrode material layer above said first sacrificial gate electrode material layer;
after forming said continuous line-type sacrificial gate structure, removing a portion of said second sacrificial gate electrode material layer and removing a portion of said first sacrificial gate electrode material layer so as to thereby form a first opening positioned above said sacrificial gate insulation layer, wherein said first opening extends through an entirety of said second sacrificial gate electrode material layer of said continuous line-type sacrificial gate structure and at least partially through said first sacrificial gate electrode material layer of said continuous line-type sacrificial gate structure;
forming an insulating gate separation structure in said first opening;
removing materials of said sacrificial gate structure on opposite sides of said insulating gate separation structure to form first and second replacement gate cavities on said opposite sides of said insulating gate separation structure; and
forming first and second replacement gate structures in said first and second replacement gate cavities, respectively.

2. The method of claim 1, wherein said first and second replacement gate structures comprise a same material.

3. The method of claim 1, wherein removing said portion of said second sacrificial gate electrode material layer and removing said portion of said first sacrificial gate electrode material layer comprises:

performing a first etching process to selectively remove said portion of said second sacrificial gate electrode material layer selectively relative to said first sacrificial gate electrode material layer to form a second layer opening that extends through an entirety of said second sacrificial gate electrode material layer and exposes an upper surface of said first sacrificial gate electrode material layer; and performing a second etching process to selectively remove said portion of said first sacrificial gate electrode material layer selectively relative to said sacrificial gate insulation layer to form a first layer opening that extends through an entirety of said first sacrificial gate electrode material layer and exposes an upper surface of said sacrificial gate insulation layer.

4. The method of claim 3, wherein performing said second etching process comprises performing an isotropic etching process such that a portion of said first layer opening extends under a portion of said second sacrificial gate electrode material layer, and wherein said insulating gate separation structure has an inverted T-shaped configuration.

5. The method of claim 3, wherein performing said second etching process comprises performing an anisotropic etching process such that said first layer opening does not extend under a portion of said second sacrificial gate electrode layer, and wherein said insulating gate separation structure has an substantially uniform width from a top of said insulating gate separation structure to a bottom of said insulating gate separation structure.

6. The method of claim 1, wherein removing said portion of said second sacrificial gate electrode material layer and removing said portion of said first sacrificial gate electrode material layer comprises:

performing a first etching process to selectively remove said portion of said second sacrificial gate electrode material layer selectively relative to said first sacrificial gate electrode material layer to form a second layer opening that extends through an entirety of said second sacrificial gate electrode material layer and exposes an upper surface of said first sacrificial gate electrode material layer; and performing a second etching process to selectively remove said portion of said first sacrificial gate electrode material layer so as to form a first layer recess within said first sacrificial gate electrode layer, said first layer recess extending only partially through said first sacrificial gate electrode material layer; and forming an internal sidewall spacer within said second layer opening and said first layer recess, said internal sidewall spacer covering sidewall surfaces of said second layer opening and said first layer recess and exposing a bottom surface of said first layer recess.

7. The method of claim 6, further comprising performing an isotropic etching process on said exposed bottom surface of said first layer recess formed in said first sacrificial gate electrode material layer so as to form a first layer opening that extends through said first sacrificial gate electrode material layer and exposes an upper surface of said sacrificial gate insulation layer, wherein said first layer opening extends under at least a portion of said internal sidewall spacer and wherein said insulating gate separation structure has an inverted T-shaped configuration.

8. The method of claim 6, further comprising performing an anisotropic etching process on said exposed bottom surface of said first layer recess formed in said first sacrificial gate electrode material layer and exposes an upper surface of said sacrificial gate insulation layer, wherein said first layer opening does not extend under said internal sidewall spacer, and wherein said insulating gate separation structure has a substantially uniform width from a top of said insulating gate separation structure to a bottom of said insulating gate separation structure.

9. The method of claim 1, wherein said insulating gate separation structure is formed in direct contact with an upper surface of said sacrificial gate insulation layer positioned below said first opening.

10. The method of claim 1, wherein forming said continuous line-type sacrificial gate structure further comprises:

forming a gate cap material layer above said second sacrificial gate electrode material layer;

patterning said gate cap material layer, said patterned gate cap material layer defining a size and position of said continuous line-type sacrificial gate structure; and performing one or more etching processes to define said continuous line-type sacrificial gate structure using said patterned gate cap material layer as an etch mask.

11. The method of claim 1, further comprising, prior to forming said first opening, forming a sidewall spacer on said continuous line-type sacrificial gate structure.

* * * * *